United States Patent [19]
Jenkins

[11] 4,441,081
[45] Apr. 3, 1984

[54] SWITCHING POWER DRIVING CIRCUIT ARRANGEMENT

[75] Inventor: Michael O. Jenkins, San Jose, Calif.

[73] Assignee: International Business Machines, Armonk, N.Y.

[21] Appl. No.: 333,548

[22] Filed: Dec. 22, 1981

[51] Int. Cl.³ .............................................. H03F 1/34
[52] U.S. Cl. .................................. 330/110; 318/678; 330/207 A
[58] Field of Search .................... 330/51, 110, 207 A, 330/251; 318/677, 678, 679, 681

[56] References Cited

U.S. PATENT DOCUMENTS 3,976,955 8/1976 Hamada ........................... 330/207 P
4,004,246 1/1977 Hamada ................................. 330/10
4,028,633 6/1977 Rogers et al. ....................... 330/118

FOREIGN PATENT DOCUMENTS 565377 7/1977 U.S.S.R. .

OTHER PUBLICATIONS

O. V. Dogadin, "A Low-Frequency Hybrid Circuit Amplifier", Telecommunication and Radio Engineering, Part I, vol. 29, Nr. 3, Mar. 1975, pp. 14–17.
F. H. Raab, "The Class BD High Efficiency RF Power Amplifier", IEEE Journal of Solid-State Circuits, vol. SC-12, Nr. 3, Jun. 1977, pp. 291–298.

*Primary Examiner*—James B. Mullins
*Attorney, Agent, or Firm*—R. E. Cummins; G. E. Roush

[57] ABSTRACT

This dual operating mode switching power driving circuit arrangement comprises an amplifying circuit of conventional form which is operated substantially as a Class A feedback amplifier in a servosystem "following" mode and is switched to operate as a Class D amplifier in the "seeking" mode under program control calling for the latter mode and reswitched to the "following" mode only at the succeeding transition of the Class D waveform whereby transients are avoided. For operating in Class D mode, the Class A feedback loop is opened and the amplifier circuit is arranged so that the input wave now overdrives the input circuit and drives the output circuit between ± values of the energy potential, whereby the efficiency is very high. A single electronic switch and logical circuitry connected thereto are arranged to deliver selectively a driving control signal from such input terminals to the input circuit of a conventional amplifier for operating it in the Class A linear second order negative feedback loop arrangement and to deliver an overdriving feedback signal from the output terminal of the amplifier, the duty cycle of which responds to load device current passing a sensing device for operating the amplifier in the Class D mode. Preferably, the application of control signals is under program control along with such control over the operation of the load device.

7 Claims, 5 Drawing Figures

WHERE: $T \triangleq$ AMP TIME CONSTANT
$T' \triangleq$ LOAD TIME CONSTANT
$\beta K \triangleq$ LOOP GAIN

SWITCHING POWER DRIVING CIRCUIT ARRANGEMENT

FIELD

The invention relates to power driving circuit arrangements of the switching type, and it particularly pertains to such circuitry for driving inductive load devices.

BACKGROUND

Positioning servosystems and like apparatus frequently will take advantage of dual mode operating circuitry. In a "seeking" mode, high power at maximum speed is of the essence, while in a "following" mode, low power with low electric noise generation is crucial.

The class A amplifier circuit is adaptable to the "following" mode in spite of poor efficiency because of its low noise. The Class D amplifier circuit has excellent efficiency physically for digital and similar applications and is capable of handling relatively high powr without a severe loss in efficiency.

SUMMARY

The objects indirectly referred to hereinbefore and those that will appear as the specification progresses are attained in a dual operating mode switching power driving circuit arrangement according to the invention. Essentially, an amplifying circuit of conventional form is operated substantially as a Class A feedback amplifier in the "following" mode and switched to operate as a Class D amplifier in the "seeking" mode under program control calling for the latter mode and reswitched to the "following" mode only at the succeeding transition of the Class D waveform whereby transients are avoided. For operating in Class D mode, the Class A feedback loop is opened and the amplifier circuit is arranged to that the input wave now overdrives the input circuit and drives the output circuit between ± values of the energizing potential, whereby the efficiency is very high.

A single electronic switch, equivalent to a single-pole double-throw electromechanical switch, and logical circuitry connected thereto are arranged to deliver selectively a driving control signal from such input terminals to the input circuit of a conventional amplifier for operating it in the Class A linear second order negative feedback loop arrangement and to deliver an overdriving feedback signal from the output terminal of the amplifier, the duty cycle of which responds to load device current passing a sensing device for operating the amplifier in the Class D mode. Preferably, the application of control signals is under program control along with such control over the operation of the load device.

In the Class A mode, the overall arrangement is arranged for adequate maintenance of the output relative to a fixed input but not for tracking a rapidly changing input. The loop gain is relatively low providing an overdamped response dominated by the relatively large time constant of an inductive load device.

In the Class B mode, the overall arrangement is converted, so to speak, to a positive feedback amplifier incorporating a Schmitt trigger circuit transfer function. The latter with the integration performed by the inductive load produces a sawtooth, or similar oscillating output current wave. The amplitude and period of the output current in the Class D mode are proportional to the hysteresis in the Schmitt trigger function, that is the amount of positive feedback. The efficiency is quite high in this mode because the losses in the amplifier circuitry are due to the small saturation potentials of the output devices found in present day IC amplifier products plus the short switching transients through the active region in accordance with the circuit arrangement according to the invention.

The logical control circuit is arranged to respond to a transition of the input logical signal level indicating that the output current has attained the desired value. The output level of the logic circuit then rises and the circuit arrangement reverts to the Class A mode of operation if the input is low.

PRIOR ART

Prior art patents and publications disclose arrangements having circuits and/or subcircuits in common with the circuit arrangement according to the invention; among the U.S. Patents are:

U.S. Pat. No. 3,976,955, August 1976, to Hamada, 330/207P;

U.S. Pat. No. 4,004,246, January 1977, to Hamada, 330/10;

U.S. Pat. No. 4,028,633, June 1977, to Rogers, et al 330/118.

In patents of other countries: Soviet Union No. 565,377, July 1977

And in the literature:

O. V. Dogadin, "A Low-Frequency Hybrid Circuit Amplifier", Telecommunication and Radio Engineering, Part I; Vol. 29, Nr. 3, March 1975, pp. 14–17.

F. H. Raab, "The Class BD High Efficiency RF Power Amplifier", IEEE Journal of Solid-State Circuits, Vol. SC-12, Nr. 3, June 1977, pp. 291–298.

The art represented by these disclosures is not particularly close. The Russian publication describes an amplifier that is continually switched between a Class A mode and a Class D mode but not selectively so as in the circuit arrangement according to the invention. Circuitry in these references is but superficially similar to circuitry in the arrangement according to the invention. Likewise, operation of the circuitry in these references shows some similarity to the operation according to the invention but upon inspection is readily seen to be superficial similarity.

DRAWINGS

In order that the advantages of the invention obtain in practice, the best mode embodiment thereof is described hereinafter, by way of example only, with reference to the accompanying drawing forming a part of the specification and in which.

DESCRIPTION

Figure 1:
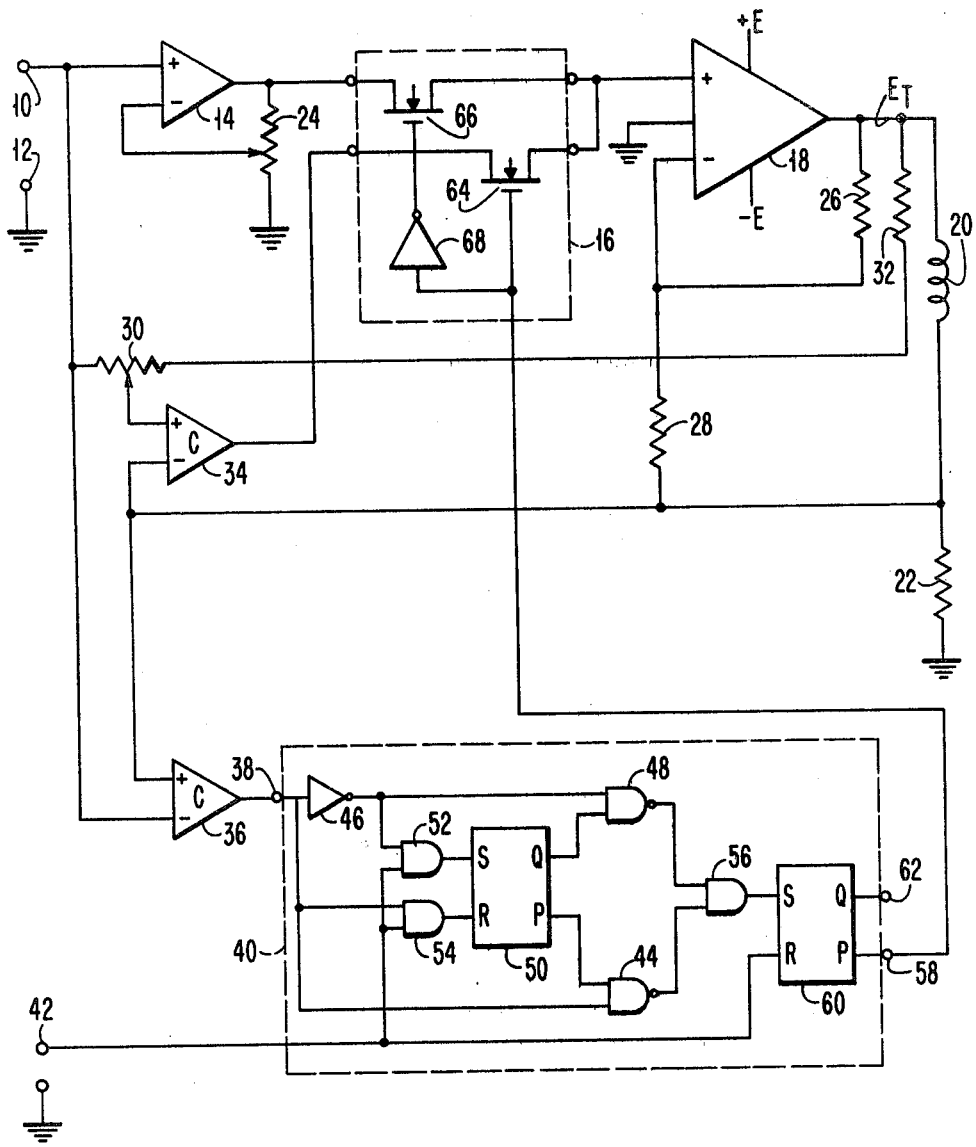
FIG. 1 is a functional diagram of one embodiment of a switching power-driving circuit arrangement according to the invention.

FIG. 1 is a functional diagram of a circuit arrangement according to the invention for driving an inductive load. A control potential wave is applied to input terminals 10,12 for application to a linear amplifier circuit 14. The output of this amplifier circuit is selected by an electronic switch 16 for applying that output to a power amplifying circuit 18 for driving an inductive load 20 in accordance with the input wave. The amplifying circuit 18 is a commercially available high potential, high output current operational amplifier, such as type PA10 made by Apex Microtechnology Corporation, Tucson, Ariz. A resistor 22 of relatively low value is interposed between the load 20 and a point of fixed reference potential shown here as ground in order to sense the value of current flowing in the load 20.

Feedback for the input amplifier circuit 14 is obtained by a potentiometer 24 connected between the output terminal and ground. Feedback for the power amplifying circuit is obtained by a potential divider comprising series connected resistors 26 and 28. The resistor 26 is connected between the output terminal of the amplifying circuit 18 and the inverted input terminal thereof, and the remote terminal of the resistor 28 is connected to ground through the current sensing resistor 22. Another potential divider comprises a potentiometer 30 and a resistor 32 connected in series between the control signal input terminal 10 and the output terminal of the amplifying circuit 18. A comparator circuit 34 has one input terminal connected to the tap of the potentiometer 30, another input terminal connected to the function among the load 20, the current sensing resistor 22 and the divider resistor 28. The output terminal of the comparator circuit 34 is connected to an alternate contact terminal of the electronic switch 16. Another comparator circuit 36 has one input terminal connected to the control signal input terminal 10 and another input terminal connected to the load 20, the sensing resitor 22 and the divider resistor 28 in the same manner as for the first comparator circuit 34. The output terminal of the comparator circuit 36 is connected to an input terminal 38 of a logical control level generating circuit 40 having another input terminal 42 and at least one output terminal 44.

As shown, the logical circuit 40 comprises one NAND gating circuit 44 and an inverter circuit 46, each having an input terminal connected to the input terminal 38. The output terminal of the inverter circuit 46 is connected directly to one input terminal of another NAND gating circuit 48. The other input terminals of the NAND gating circuits 44 and 48 are connected respectively to P(=Q) and Q output terminals of a flip-flop circuit 50. The set (S) and reset (R) terminals of the latter are respectively connected to the output terminals of AND gating circuits 52 and 54. Input terminals of the latter circuits are respectively connected individually to the output terminals of the inverter circuit 46 and to the input terminals 38, while the remaining input terminals of the AND gating circuits 52 and 54 are connected in common to the input terminal 42. The output terminals of the previously mentioned NAND gating circuits 44 and 48 are connected to the input terminals of a further AND gating circuit 56, the output terminal of which is connected to the set terminal of another flip-flop circuit 60. The reset terminal of the latter is connected to the input terminal 42 of the logic circuit 40. The P and Q output terminals of the flipflop circuit 60 are connected to the output terminals 44 and 62 of the logic circuit 40. As shown, the P output at terminal 44 is conveyed to the switch 16.

The switch 16 for clarity is depicted as two field effect or like transistors 64 and 66 in a simple switching circuit with one switch closed and one switch open due to the use of an inverting circuit 68. Alternately, the same effect is obtained by connecting the transistor 66 to the Q output terminal 62 of the logical circuit. Those skilled-in-the-art will adapt a conventional switch to their purpose. One example of a commercially available switch is type MC14066B made by Motorola, Inc., Phoenix, Ariz.

Figure 2:
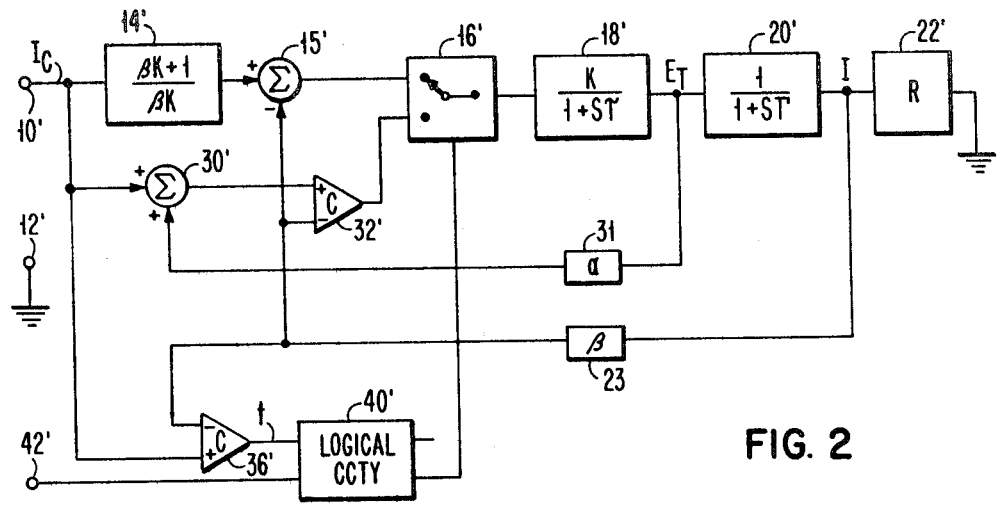
FIG. 2 is a diagram showing the functioning of the embodiment according to the invention shown in the previous figure.

FIG. 2 is a diagram of the embodiment described above which emhasizes the mathematically expressible aspects that are important particularly where a single component group performs more than a single function. An analog signal is applied at the input terminal 10' for controlling the load device; that is, the current I flowing in the sensing functional block 22' will be relatively low or high. The mode of operation is controlled by a bilevel signal applied to the control terminal 42', that is, a relatively high level of control signal will effect Class D operation and a relatively low level will permit return to Class A operation after the output potential next equals the input value. The power amplifier equivalent 18', the inductor equivalent 20'/sense resistor equivalent 22' and the feedback function path 23 comprise a standard second order feedback (B) control amplifier system—a Class A amplifier. For this application, the amplifier equivalent 18' time constant is much faster than the inductor equivalent 20' time constant ($\tau << Y$) and the loop gain, $\beta K$ is low, providing an overdamped stable system.

When a high level signal is applied to the terminal 42', the output of the logic circuitry 40' goes low immediately, enabling the positive hysteresis feedback function path 31. The amplifier output potential $E_T$ oscillates between $\pm E_T$ max and is arranged by the load circuit equivalent 20'. The feedback circuitry is arranged to maintain the average current I equal to the input current $I_C$ at the terminal 10'.

The logical circuit 40' is arranged so that when the level at the control signal input terminal 42 falls, the changeover from Class D to Class A is delayed for a transition of the output potential at terminal 38 indicating that the output of the amplifier equivalent 18' is at the final value. The output terminal 44 of the logical circuit then rises, reverting operation to the Class A mode.

Figure 3:
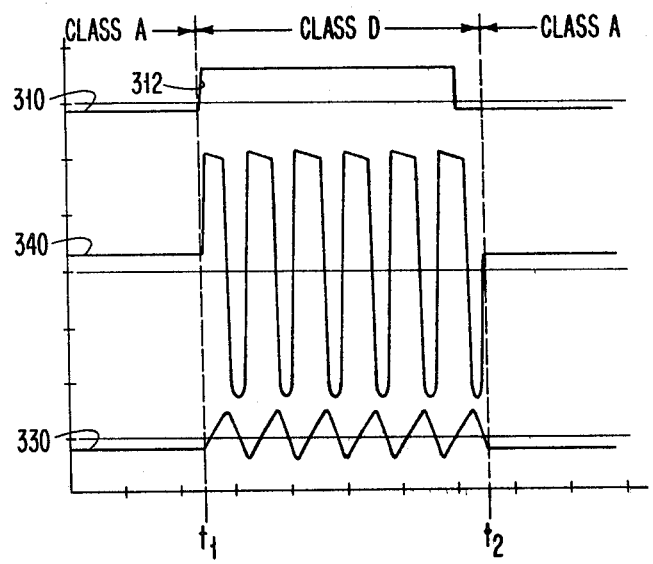
FIG. 3 is a graphical representative of waveforms obtained which are useful in an explanation of the operation of the invention.
Figure 4:
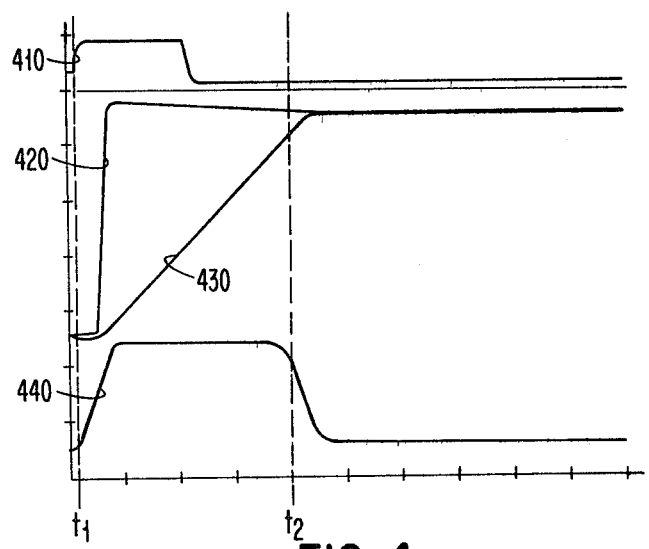
FIG. 4 is a graphical representation of an actual step response of the circuitry according to the invention.

Referring to FIG. 3, there is a graphical representation of waveforms found in operation of the power driving circuit arrangement. A curve 310 represents the control signal wave at the terminal 42, while curve 330 represents the output current wave into the device 20'. A curve 340 represents the potential wave at the output terminal of the amplifier 18. As shown by the curves in FIG. 4, the arrangement is initially in the Class A mode. The control signal, curve 410, at the logical circuit input terminal 42 is brought up at 312, at the same time $t_1$ as the input signal at the input terminals 10,12 forcing operation into the Class D mode. The output potential rises immediately to the + or − limits of the power supply and remain there until the output current, curve 430, reaches the target at time $t_2$. At that time, the control potential at the terminal 38 switches and since the level at the terminal 42 has fallen, before time $t_2$, curve 410, the logical level output at the terminal 44 comes up and switches the circuit arrangement back into the Class A mode at time $t_2$ wherein the amplifier output potential $E_T$ drops to the final value. Inasmuch as the potential $E_T$ was at the maximum value throughout the transient, the time required for the output current, curve 430, is the least possible in which adequate performance obtains.

Figure 5:
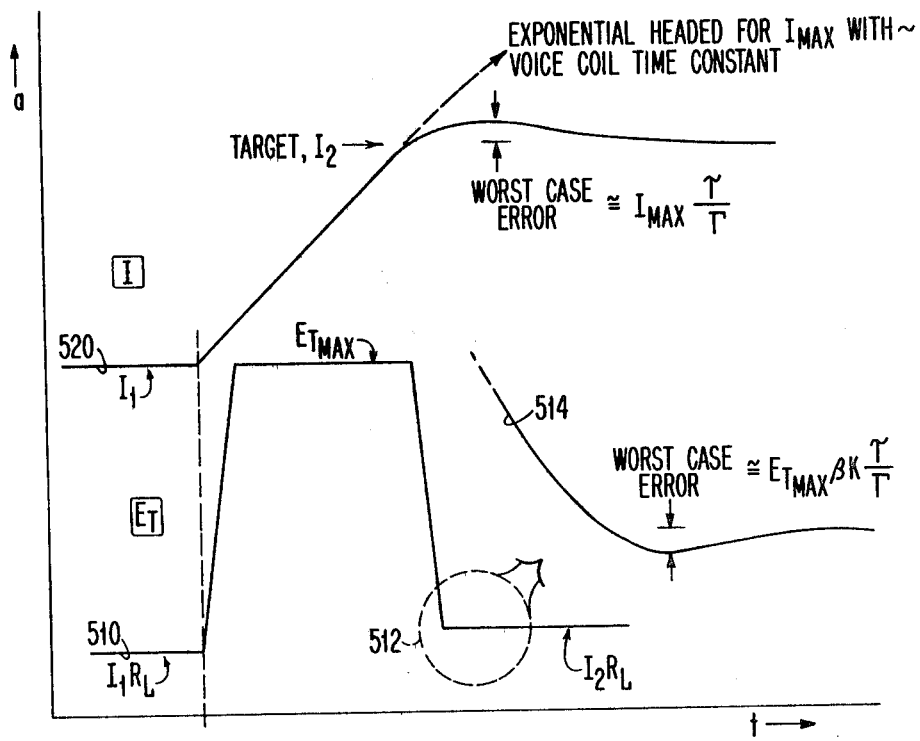
FIG. 5 is a graphical representation of ideal waveforms useful in the design of circuitry in accordance with the invention.

FIG. 5 is a schematic showing of ideal waveforms useful in the design of circuitry according to the invention. A curve 510 represents a portion of the output potential wave and a portion 512 of this curve is expanded as a curve 514. Another curve 520 represents the output current wave corresponding in turn to the curve 510.

If the positive feedback is inhibited when the current reaches its target, the remaining I and $E_T$ waveforms are sums of two exponentials with time constants $\tau$ and Y (assuming a very overdamped loop). If $\tau$ is much less than Y, the overshoot of the current is bounded as shown. The voltage returns from saturation to its target in $$\tau ln(Y/\tau(\beta K+1))$$

then overshoots the amount shown.

For the actual circuit measured, the parameters are:
Y = 250 µS
$\beta$ = 1/20
K = 20
$f_t$ = K/2   $\tau$ = 3 MHz
$\tau$ = 1.06 µS For these values, the voltage and current overshoots are about 0.4 percent of full scale, or about 8 bits of accuracy, and the voltage reaches its target 4.6 µS after leaving saturation. If the same components were configured in a high gain, critically damped, Class A amplifier, the voltage would still remain saturated for about 20 µS (for a 100 mA step), then take 5×16 µS to settle to within 1 percent of full scale.

Other advantages of the dual mode approach are (1) The flexibility of mode control by the microprocessor, allowing high efficiency Class D operation to be selected at any time, (2) The logic output at the terminal 44 which indicates the termination of a transient, and (3) The inherently better stability of a low gain, overdampled loop.

The circuit arrangement according to the invention has a number of features recommending use in many applications. The load device itself is the sole reactive element, whereby integrating functions are quite feasible. A single smoothly operating switching device enables passing from mode-to-mode with little electric disturbances, that is "switching noise". A logical output signal is available for indicating that the output current has attained a desired level and for use in other circuits for control as those skilled-in-the-art will decide.

While the invention has been described in terms of an express embodiment, and alternatives have been suggested, it is clearly to be understood that those skilled in the art will effect further changes without departing from the spirit and scope of the invention as defined in the appended claims.

The invention claimed is:

1. A switching power driving circuit arrangement for driving a given load device in response to a driving control signal, comprising an amplifying circuit arrangement having an input subcircuit, having an output subcircuit, and having two energizing potential terminals, a source of direct energizing potential connected across said energizing potential terminals, a load current sensing element connected in series circuit with said load device to said output subcircuit of said amplifying circuit arrangement, a negative feedback circuit connected between said output and said input subcircuits, a switching circuit having an output terminal coupled to said input subcircuit, having one input terminal to which said driving control signal is applied, having another input terminal and having a control input terminal, a positive feedback circuit connected between said sensing device and said other terminal of said switching circuit, circuitry connected to said switching circuit control input terminal for selectively applying said driving control signal to said input subcircuit and said positive feedback circuit thereto for overdriving said input subcircuit and effecting said output subcircuit to alternate between the limits of said direct energizing potential.

2. A switching power driving circuit arrangement as defined in claim 1 and wherein said negative feedback circuit is referenced to said positive feedback circuit at said sensing device.

3. A switching power driving circuit arrangement as defined in claim 1 and incorporating a comparator circuit interposed in said positive feedback circuit with an output terminal connected to said other input terminal of said switching circuit and with one input terminal connected to said sensing device and with another input terminal to which said driving control signal is applied.

4. A switching power driving circuit arrangement for driving a given load device in response to a driving control signal, comprising an amplifying circuit arrangement having an input terminal and an output terminal and two energizing potential terminals, a source of direct energizing potential connected to said two energizing potential terminals of said amplifying circuit arrangement, a load current sensing element connected in series circuit with said given load device to said output terminal of said amplifying circuit arrangement, a switching circuit having an output terminal connected to said input terminal of said amplifying circuit arrangement, one input terminal to which said driving control signal is applied, another input terminal and a control terminal, a feedback circuit interconnecting said sensing element and said other input terminal of said switching circuit, circuitry connected to said feedback path and to output terminal of said amplifying circuit arrangement for applying a level of signal to said other input of said switching circuit for overdriving said amplifying circuit, and a logical circuit arrangement having an output terminal connected to said control terminal of said switching circuit and having one input terminal to which said driving control signal is applied and having another input terminal to which said feedback path is connected, whereby said logical circuit effectively switches said amplifying circuit arrangement from a linear mode of operation in response to said driving control signal to an overdriven mode operation in response to the relative values of said driving control signal and the signal in said feedback path.

5. A switching power driving circuit arrangement as defined in claim 4 and wherein
said load device substantially is an inductor, and said sensing device substantially is a resistor.

6. A switching power driving circuit arrangement for driving a given inductive reactive load device in response to a driving control signal, comprising
a differential Class A amplifying circuit arrangement having differential input terminals and an output terminal and two energizing potential terminals,
a source of direct energizing potential connected to said two energizing potential terminals of said amplifying circuit arrangement,
a load current sensing element connected in series circuit with said given load device in said output terminal of said amplifying circuit arrangement,
a switching circuit having an output terminal connected to the other of said input terminals of said amplifying circuit arrangement, one input terminal to which said driving control signal is applied, another input terminal and a control terminal,
one comparator circuit having an output terminal connected to said other input terminal of said switching circuit, having one input terminal connected to said sensing element and having the other input terminal coupled to the output terminal of said amplifying circuit arrangement,
a logical circuit arrangement having an output terminal connected to said control terminal of said switching circuit, having one input terminal, and having another input terminal to which a logical control signal is applied, and
another comparator circuit having an output terminal connected to said one input terminal of said logical circuit, having one input terminal to which said driving control signal is applied and having another input terminal connected to said sensing element.

7. A switching power driving circuit arrangement as defined in claim 6 and wherein
the other input of said differential amplifying circuit arrangement is coupled to the output terminal thereof by a resistor forming a part of a potential divider comprising another resistor connected to said other input terminal of the differential amplifier circuit and said sensing element.

* * * * *